(12) United States Patent
Cai et al.

(10) Patent No.: US 12,225,697 B2
(45) Date of Patent: Feb. 11, 2025

(54) DISPLAY MODULE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yangyang Cai, Beijing (CN); Hengzhen Liang, Beijing (CN); Zhihao Xie, Beijing (CN); Ying Zhang, Beijing (CN); Hang Min, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/022,379

(22) PCT Filed: Jun. 30, 2022

(86) PCT No.: PCT/CN2022/102790
§ 371 (c)(1),
(2) Date: Feb. 21, 2023

(87) PCT Pub. No.: WO2024/000392
PCT Pub. Date: Jan. 4, 2024

(65) Prior Publication Data
US 2024/0284648 A1 Aug. 22, 2024

(51) Int. Cl.
*H05K 1/18* (2006.01)
*H05K 7/20* (2006.01)

(52) U.S. Cl.
CPC ......... *H05K 7/20963* (2013.01); *H05K 1/189* (2013.01); *H05K 2201/10128* (2013.01)

(58) Field of Classification Search
CPC ............... H05K 7/20963; H05K 1/189; H05K 2201/10128
(Continued)

(56) References Cited

U.S. PATENT DOCUMENTS

| | | | |
|---|---|---|---|
| 2022/0110226 A1 | 4/2022 | Zhang et al. | |
| 2023/0105863 A1* | 4/2023 | Kim | H05K 5/0018 361/707 |
| 2023/0199990 A1* | 6/2023 | Shin | H05K 7/20963 361/807 |

FOREIGN PATENT DOCUMENTS

| CN | 210535212 U | 5/2020 |
|---|---|---|
| CN | 111640708 A | 9/2020 |

(Continued)

*Primary Examiner* — Binh B Tran
(74) *Attorney, Agent, or Firm* — WHDA, LLP

(57) ABSTRACT

A display module is provided, including a display panel and a flexible printed circuit (FPC) bonded to the display panel; the display panel includes a display area and a non-display area disposed at the periphery of the display area, the non-display area includes a bonding area disposed on one side of the display area, and a driver integrated circuit (IC) is disposed in the bonding area; the FPC includes a main body part, an orthographic projection of the main body part onto the display panel is in the bonding area, and a first accommodating groove for accommodating the driver IC is provided in a first surface of the FPC close to the display panel; a heat dissipation structure extending from within the first accommodating groove to outside the FPC is further disposed between the FPC and the bonding area. A display device is further provided.

20 Claims, 5 Drawing Sheets

(58) Field of Classification Search
USPC .......................................................... 361/749
See application file for complete search history.

(56) References Cited

FOREIGN PATENT DOCUMENTS

| | | | |
|---|---|---|---|
| CN | 112867245 | A | 5/2021 |
| CN | 113066393 | A | 7/2021 |
| CN | 113133201 | A | 7/2021 |
| CN | 113514989 | A | 10/2021 |
| CN | 113539091 | A | 10/2021 |
| JP | 2010251357 | A | 11/2010 |

* cited by examiner

DISPLAY MODULE AND DISPLAY DEVICE

CROSS-REFERENCE TO RELATED APPLICATIONS

This application is the U.S. national phase of PCT Application No. PCT/CN2022/102790 filed on Jun. 30, 2022, the disclosure of which is hereby incorporated by reference in its entirety.

TECHNICAL FIELD

The present disclosure relates to the field of display product manufacturing technology, and more particularly to a display module and a display device.

BACKGROUND

In order to make more space for the battery compartment of the product, an organic light-emitting diode (OLED) module is realized by adopting a reverse bonding structure. With the reverse bonding structure, a flexible printed circuit is placed reversely on the driver integrated circuit (IC), and blind holes are formed to avoid the IC. However, the driver IC is placed within an enclosed space, which is not conducive to the heat dissipation of the driver IC.

SUMMARY

In order to solve the above-mentioned technical problem, the present disclosure provides a display module and a display device, which solve the heat dissipation problem of a driver IC of a reverse bonding structure.

In order to achieve the above object, embodiments of the present disclosure provide a technical solution: a display module, including a display panel and a flexible printed circuit bonded to the display panel;

the display panel includes a display area and a non-display area at the periphery of the display area, the non-display area includes a bonding area on one side of the display area, and a driver IC is disposed in the bonding area;

the flexible printed circuit includes a main body part, the orthographic projection of the main body part onto the display panel is in the bonding area, and the first surface of the flexible printed circuit close to the display panel is provided with a first accommodating groove for accommodating the driver IC;

a heat dissipation structure extending from within the first accommodating groove to outside the flexible printed circuit is further disposed between the flexible printed circuit and the bonding area.

Optionally, the heat dissipation structure includes a heat-conducting metal structure disposed between the flexible printed circuit and the bonding area.

Optionally, the heat dissipation structure further includes an electrical-insulating and heat-conducting adhesive layer between the heat-conducting metal structure and the driver IC.

Optionally, at least a portion of the driver IC is covered by the electrical-insulating and heat-conducting adhesive layer.

Optionally, the electrical-insulating and heat-conducting adhesive layer is disposed between at least some of side walls of the first accommodating groove and the driver IC, the heat-conducting metal structure includes a metal sheet, the metal sheet is disposed between the flexible printed circuit and the bonding area, one end of the metal sheet extends into the first accommodating groove and is attached to the electrical-insulating and heat-conducting adhesive layer, and the other end of the metal sheet extends out of the flexible printed circuit in a direction away from the first accommodating groove.

Optionally, the electrical-insulating and heat-conducting adhesive layer is disposed between some of the side walls of the first accommodating groove and the driver IC, and the first surface of the flexible printed circuit includes a first region disposed at the some of the side walls and away from the accommodating groove, the first region being recessed to form an accommodating space between the flexible printed circuit and the display panel for accommodating the metal sheet.

Optionally, at least one first through hole extending along a direction perpendicular to the first surface is formed in the flexible printed circuit, the first through hole extends from a bottom of the first accommodating groove in a direction away from the first surface and penetrates a second surface of the flexible printed circuit opposite to the first surface, and the orthographic projection of the first through hole onto the display panel is within the orthographic projection of the electrical-insulating and heat-conducting adhesive layer onto the display panel.

Optionally, the electrical-insulating and heat-conducting adhesive layer surrounds and covers the driver IC externally, and the metal sheet is an annular structure enclosing the electrical-insulating and heat-conducting adhesive layer peripherally.

Optionally, the metal sheet is a copper foil.

Optionally, the heat dissipation structure further includes a heat dissipation member attached to a portion of the metal sheet exposed outside the flexible printed circuit.

Optionally, the heat dissipation member is a thermal conductive adhesive at least partially overlying the portion of the metal sheet exposed outside the flexible printed circuit.

Optionally, the heat dissipation structure includes:
a heat dissipation hole provided at the bottom of the first accommodating groove and penetrating the flexible printed circuit;
a first heat-conducting metal member, wherein the first heat-conducting metal member includes a first portion passing through the heat dissipation hole, and a second portion extending into the first accommodating groove and being attached to the display panel, and the second portion is a second accommodating groove enclosing the driver IC externally.

Optionally, the heat dissipation structure further includes a second heat-conducting metal member attached to the first heat-conducting metal member, and the second heat-conducting metal member is disposed in parallel on a second surface of the flexible printed circuit opposite to the first surface.

Optionally, a space between the first portion and the heat dissipation hole is filled with an electrical-insulating and heat-conducting adhesive layer, a space between the second portion and the first accommodating groove is filled with an electrical-insulating and heat-conducting adhesive layer, and a space between the second heat-conducting metal member and the second surface is filled with an electrical-insulating and heat-conducting adhesive layer.

Optionally, the driver IC has a strip-shaped structure, and the heat dissipation structure includes one or more heat dissipation units distributed along an extending direction of the driver IC, each of the heat dissipation units including the heat dissipation hole and the first heat-conducting metal member.

Optionally, the driver IC is surrounded and covered externally by an electrical-insulating and heat-conducting adhesive layer.

Optionally, a bonding part for bonding to a display panel is disposed on the flexible printed circuit, and the bonding part and the first accommodating groove are located on the same side of the flexible printed circuit.

Embodiments of the present disclosure further provide a display device including the above-mentioned display module.

Advantageous effects of the present disclosure are: the heat dissipation problem of a driver IC of a reverse bonding structure is solved by the arrangement of the heat dissipation structure.

DETAILED DESCRIPTION

Figure 1:
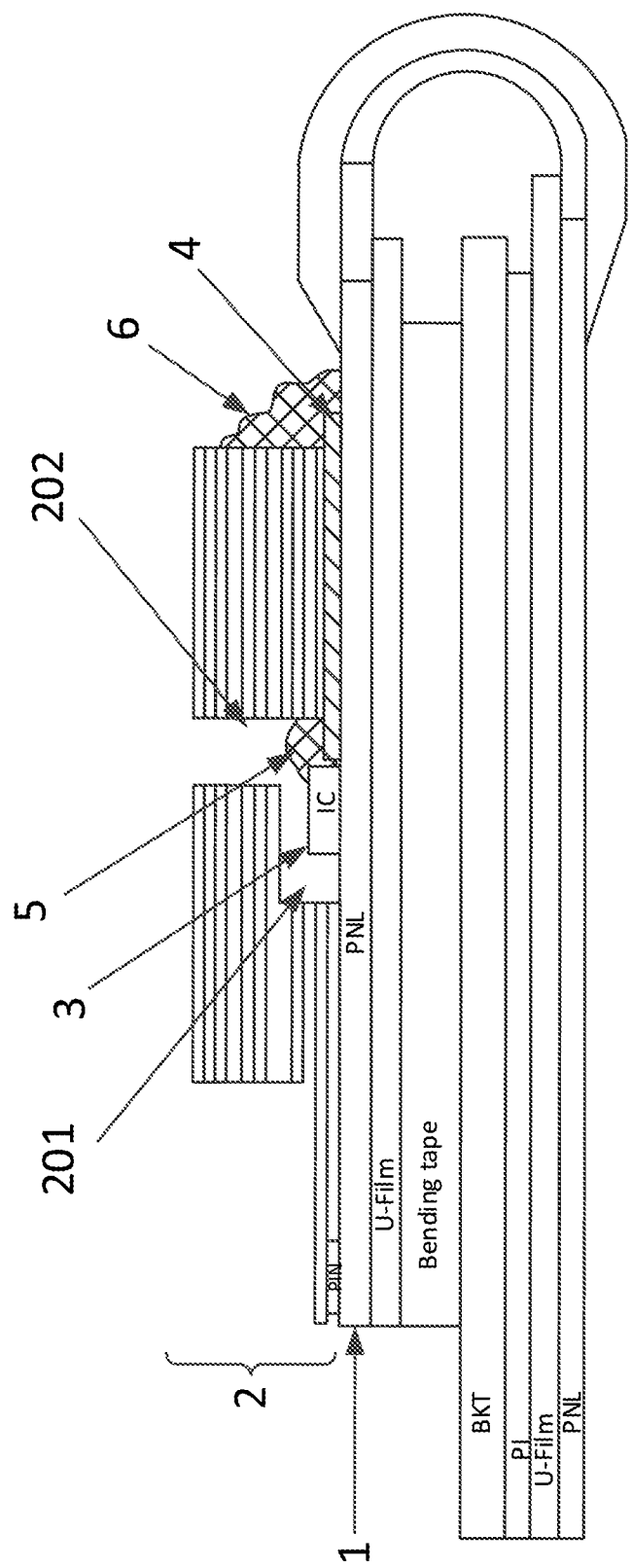
FIG. 1 is a schematic structural diagram of a display module according to an embodiment of the present disclosure.

In order that the objects, aspects and advantages of the embodiments of the present disclosure will become more apparent, a more particular description of the embodiments of the present disclosure will be rendered by reference to the appended drawings. It is to be understood that the described embodiments are part, but not all, of the disclosed embodiments. Based on the embodiments of the present disclosure described, all other embodiments occurring to one of ordinary skill in the art are within the scope of the present disclosure.

In describing the present disclosure, it should be noted that the terms "central", "upper", "lower", "left", "right", "vertical", "horizontal", "inside", "outside", and the like indicate orientations or positional relationships based on the orientations or positional relationships shown in the drawings, merely to facilitate description of the present disclosure and simplify the description, and do not indicate or imply that the referenced devices or elements must have a particular orientation, be constructed and operated in a particular orientation, and thus should not be construed as limiting the present disclosure. Furthermore, the terms "first", "second", and "third" are used for descriptive purposes only and are not to be construed as indicating or implying relative importance.

The flexible printed circuit is in a bonding connection with the driver IC on the display panel. In a conventional bonding structure, the driver IC is not covered from above, and the heat of the driver IC can be dissipated via thermal convection or a medium such as electrically conductive fabric; however, in a reverse bonding scheme of the flexible printed circuit, the flexible printed circuit is placed reversely on the driver IC, and an avoiding hole is formed in the flexible printed circuit to avoid the driver IC, such that the driver IC is situated in an enclosed space, and has poor heat dissipation. With reference to FIGS. 1 to 10, in order to address the above-mentioned problem, the embodiment provides a display module, including a display panel 1 and a flexible printed circuit 2 bonded to the display panel 1.

The display panel 1 includes a display area and a non-display area at the periphery of the display area, the non-display area includes a bonding area on a side of the display area, and a driver IC 3 is disposed in the bonding area.

The flexible printed circuit 2 includes a main body part 21, the orthographic projection of the main body part 21 onto the display panel 1 is in the bonding area, and a first accommodating groove 201 for accommodating the driver IC 3 is formed in a first surface of the flexible printed circuit 2 that is close to the display panel 1.

Further, a heat dissipation structure extending from within the first accommodating groove 201 to outside of the flexible printed circuit 2 is disposed between the flexible printed circuit 2 and the bonding area.

By adding the heat dissipation structure to guide the heat from the driver IC 3 to outside the flexible printed circuit 2, the heat dissipation of the driver IC 3 can be implemented adequately, thereby solving the problem of poor heat dissipation of the driver IC 3 of a reverse bonding structure.

It is noted that, in this embodiment, the bonding connection between the flexible printed circuit 2 and the display panel 1 is reverse bonding, and in one implementation, the flexible printed circuit 2 is provided with a bonding part for bonding to the display panel 1, and the bonding part and the first accommodating groove 201 are located on the same side of the flexible printed circuit 2.

In an exemplary implementation, the heat dissipation structure includes a heat-conducting metal structure 4 disposed between the flexible printed circuit 2 and the bonding area.

The heat-conducting metal structure 4 may be arranged in parallel with the first surface of the flexible printed circuit 2, and the heat-conducting metal structure 4 may be a copper foil, but this is not limiting.

The heat-conducting metal structure 4 is spaced apart from the driver IC 3 to avoid problems such as a short circuit.

In an exemplary implementation, the heat dissipation structure further includes an electrical-insulating and heat-conducting adhesive layer (see the first electrical-insulating and heat-conducting adhesive layer 5 in FIG. 1) between the heat-conducting metal structure 4 and the driver IC 3.

The arrangement of the electrical-insulating and heat-conducting adhesive layer facilitates heat dissipation and protects the driver IC 3.

In an exemplary implementation, at least a portion of the driver IC 3 is covered by the electrical-insulating and heat-conducting adhesive layer.

The electrical-insulating and heat-conducting adhesive layer may be provided only on one side of the driver IC 3 that is close to the heat-conducting metal structure 4; the electrical-insulating and heat-conducting adhesive layer may also completely envelop the driver IC 3; and in the implementation where the electrical-insulating and heat-conducting adhesive layer completely envelops the driver IC 3, the electrical-insulating and heat-conducting adhesive layer may have a better protection function for the driver IC 3, but this is not limiting.

In an exemplary implementation, the electrical-insulating and heat-conducting adhesive layer is disposed between at least some side walls of the first accommodating groove 201 and the driver IC 3, the heat-conducting metal structure 4 includes a metal sheet, the metal sheet is disposed between the flexible printed circuit 2 and the bonding area, one end of the metal sheet extends into the first accommodating groove 201 and is attached to the electrical-insulating and heat-conducting adhesive layer, and the other end of the metal sheet extends out of the flexible printed circuit 2 in a direction away from the first accommodating groove 201.

If the cross-sectional shape of the first accommodating groove 201 in a direction parallel to the first surface is rectangular, the first accommodating groove 201 includes four side walls, then the heat-conducting metal structure 4 may include a plurality of metal sheets arranged in one-to-one correspondence with at least one side wall. The plurality of metal sheets may be independently arranged or may be connected as an integral structure.

It is noted that the metal sheet may be attached to the flexible printed circuit 2 or the display panel 1.

In the exemplary implementation, the electrical-insulating and heat-conducting adhesive layer is disposed between some of side walls of the first accommodating groove 201 and the driver IC 3, the first surface of the flexible printed circuit 2 includes a first region at the some side walls and away from the accommodating groove, the orthographic projection of the metal sheet onto the flexible printed circuit is in the first region, and the first region is recessed to form an accommodating space between the flexible printed circuit 2 and the display panel 1 for accommodating the metal sheet.

The electrical-insulating and heat-conducting adhesive layer is disposed between some of the side walls of the first accommodating groove 201 and the driver IC 3, and the metal sheets are arranged in correspondence with the some side walls of the first accommodating groove 201. Since the heat-conducting metal structure 4 is arranged only in correspondence with some of the side walls of the first accommodating groove 201, namely, the heat-conducting metal structure 4 is not annular, if the accommodating space does not exist, then a gap would occur between the flexible printed circuit 2 and the display panel 1 in a region where the heat-conducting metal structure 4 is not arranged. The accommodating space prevents the occurrence of the gap between the flexible printed circuit 2 and the display panel 1 due to the arrangement of the heat-conducting metal structure 4, thereby ensuring the connection stability between the flexible printed circuit 2 and the display panel 1.

In an exemplary implementation, the electrical-insulating and heat-conducting adhesive layer surrounds and covers the driver IC 3 externally, and the metal sheet is an annular structure enclosing the electrical-insulating and heat-conducting adhesive layer peripherally.

The metal sheet being arranged in an annular structure facilitates heat dissipation, and omits the arrangement of the accommodating space, compared with the implementation in which the metal sheets are arranged in correspondence with some side walls of the first accommodating groove 201.

In an exemplary implementation, at least one first through hole 202 extending along a direction perpendicular to the first surface is formed in the flexible printed circuit 2, the first through hole 202 extends from the bottom of the first accommodating groove 201 in a direction away from the first surface and penetrates a second surface of the flexible printed circuit 2 that is opposite to the first surface, and the orthographic projection of the first through hole 202 onto the display panel 1 is within the orthographic projection of the electrical-insulating and heat-conducting adhesive layer onto the display panel.

Owe to the arrangement of the first through hole 202, the electrical-insulating and heat-conducting adhesive layer can be formed by performing adhesive dispensing using adhesive dispensing equipment, such as an adhesive dispensing nozzle, after the flexible printed circuit 2 is assembled with the display panel 1.

The electrical-insulating and heat-conducting adhesive layer is formed by processing steps, such as adhesive dispensing and UV curing. The configuration of the electrical-insulating and heat-conducting adhesive layer is performed before the flexible printed circuit 2 is placed onto the display panel 1. In order to facilitate the assembly of the flexible printed circuit 2 and the display panel 1, the accommodating space of the first accommodating groove 201 needs to reserve the space for the electrical-insulating and heat-conducting adhesive layer so as to avoid interference. After the flexible printed circuit 2 is placed onto the display panel 1, the adhesive is dispensed through the first through hole 202 by means of an adhesive dispensing tool, such as an adhesive dispensing nozzle 100, without taking excessive consideration of the space configured for the electrical-insulating and heat-conducting adhesive layer (in order to avoid interference with the driver IC 3, the configuration of the first accommodating groove 201 would take account of assembly errors, that is, an interference clearance would be reserved between the side wall of the first accommodating groove 201 and the driver IC 3, and the clearance would be sufficient for arranging the electrical-insulating and heat-conducting adhesive layer). Thus, it is possible to reduce the space of the first accommodating groove 201, thereby reducing the area of the flexible printed circuit 2 occupied by the first accommodating groove 201.

The orthographic projection of the first through hole 202 onto the display panel 1 is within the orthographic projection of the electrical-insulating and heat-conducting adhesive layer onto the display panel, which facilitates the formation of the electrical-insulating and heat-conducting adhesive layer.

It should be noted that, the quantity of the first through holes 202 can be set according to actual needs. For example, if the heat-conducting metal structure 4 is only arranged in correspondence with one side wall of the first accommodating groove 201, then only one first through hole 202 needs to be provided at this time, but this is not limiting.

Figure 2:
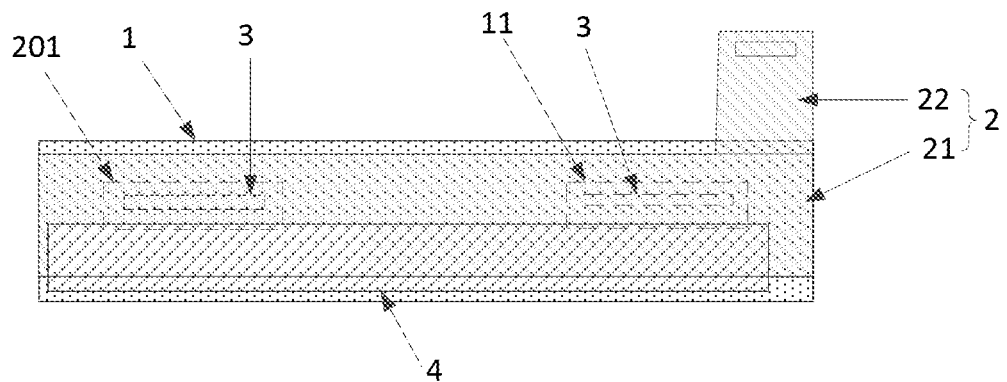
FIG. 2 is a schematic diagram showing a partial structure of a bonding connection between a flexible printed circuit and a display panel according to an embodiment of the present disclosure.
Figure 3:
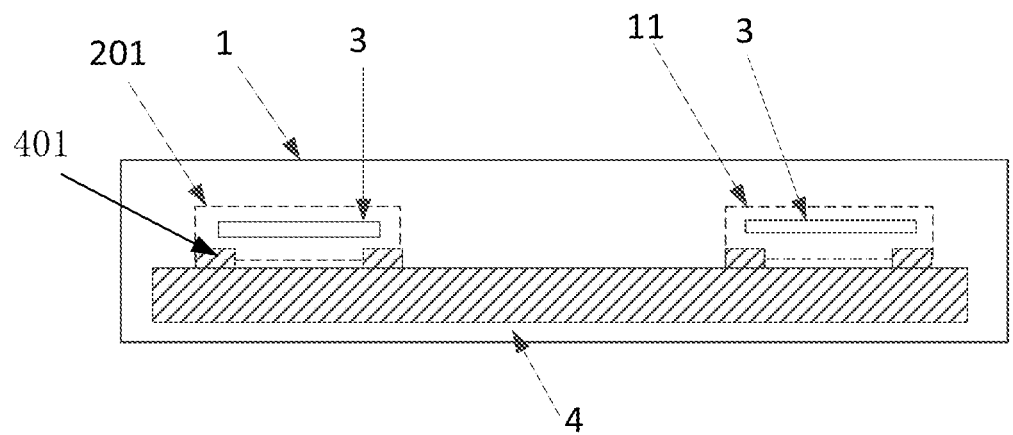
FIG. 3 is a structural diagram showing a heat-conducting metal structure according to an embodiment of the present disclosure.

The specific structural forms of the heat-conducting metal structure can be various; with reference to FIGS. 2 and 3 (the first heat-conducting adhesive layer 5 is not shown), the dotted rectangle in FIG. 3 denotes the orthographic projection of the first accommodating groove 201 onto the display panel 1, two driver ICs 3 are spaced apart on the display panel in a first direction, the heat-conducting metal structure includes a strip-shaped metal sheet, and the strip-shaped metal sheet is correspondingly arranged at one side of one side wall of the first accommodating groove 201. In the example of FIG. 2, the strip-shaped metal sheet extends into the first accommodating groove 201 as a whole. In the example of FIG. 3, the strip-shaped metal sheet includes several extension protrusions 401 arranged in correspondence with the driver IC, the extension protrusions 401 extend into the first accommodating groove 201. In FIG. 3, two extension protrusions are arranged in correspondence with each driver IC, but the quantity of the extension protrusions is not limited thereto. In this way, the overall area of the heat-conducting metal structure can be reduced.

In an exemplary implementation, the metal sheet is a copper foil, but this is not limiting.

The thickness of the metal sheet may be set according to practical requirements, and may be 20 μm to 0.4 mm, for example.

In an exemplary implementation, the heat dissipation structure further includes a heat dissipation member 6. The heat dissipation member 6 is attached to a portion of the metal sheet that is exposed outside the flexible printed circuit 2.

The arrangement of the heat dissipation member enhances the heat dissipation effect.

In an exemplary implementation, the heat dissipation member is a thermal conductive adhesive at least partially overlying the portion of the metal sheet that is exposed outside the flexible printed circuit 2.

Illustratively, the thermal conductive adhesive and the first electrical-insulating and heat-conducting adhesive layer 5 may be made of the same material, but this is not limiting.

It is noted that, the flexible printed circuit 2 further includes an extension part 22 formed by an outward extending portion of the main body part 21, and a connecting element for establishing a connection to a main circuit board is disposed on the extension part 22, with reference to FIG. 2.

Referring to FIGS. 4 to 10, in an exemplary implementation, the heat dissipation structure includes:
a heat dissipation hole 203 arranged at the bottom of the first accommodating groove 201 and penetrating the flexible printed circuit 2;
a first heat-conducting metal member 8, wherein the first heat-conducting metal member 8 includes a first portion 81 passing through the heat dissipation hole 203, and a second portion 82 extending into the first accommodating groove 201 and attached to the display panel 1, and the second portion 82 is a second accommodating groove enclosing the driver IC 3 externally.

The first portion 81 may be a pillar structure conforming to the shape of the heat dissipation hole 203, and the shape of the second portion 82 may conform to the shape of the first accommodating groove 201, but the present disclosure is not limited thereto.

The first heat-conducting metal member 8 is made of a copper material, but the present disclosure is not limited thereto.

In an exemplary implementation, the heat dissipation structure further includes a second heat-conducting metal member 7 attached to the first heat-conducting metal member 8, and the second heat-conducting metal member 7 is arranged in parallel on a second surface of the flexible printed circuit 2 that is opposite to the first surface.

The arrangement of the second heat-conducting metal member 7 increases the heat dissipation area, so that the heat conducted out by the first heat-conducting metal member can be rapidly dissipated, to achieve rapid temperature reduction.

The second heat-conducting metal member 7 may be a copper foil, but the present disclosure is not limited thereto.

It is noted that, the length of the first portion 81 of the first heat-conducting metal member 8 is greater than the length of the heat dissipation hole 203, that is, a part of the first portion 81 is exposed outside the heat dissipation hole 203, such that the first heat-conducting metal member 8 can be easily attached to the second heat-conducting metal member 7.

Figure 4:
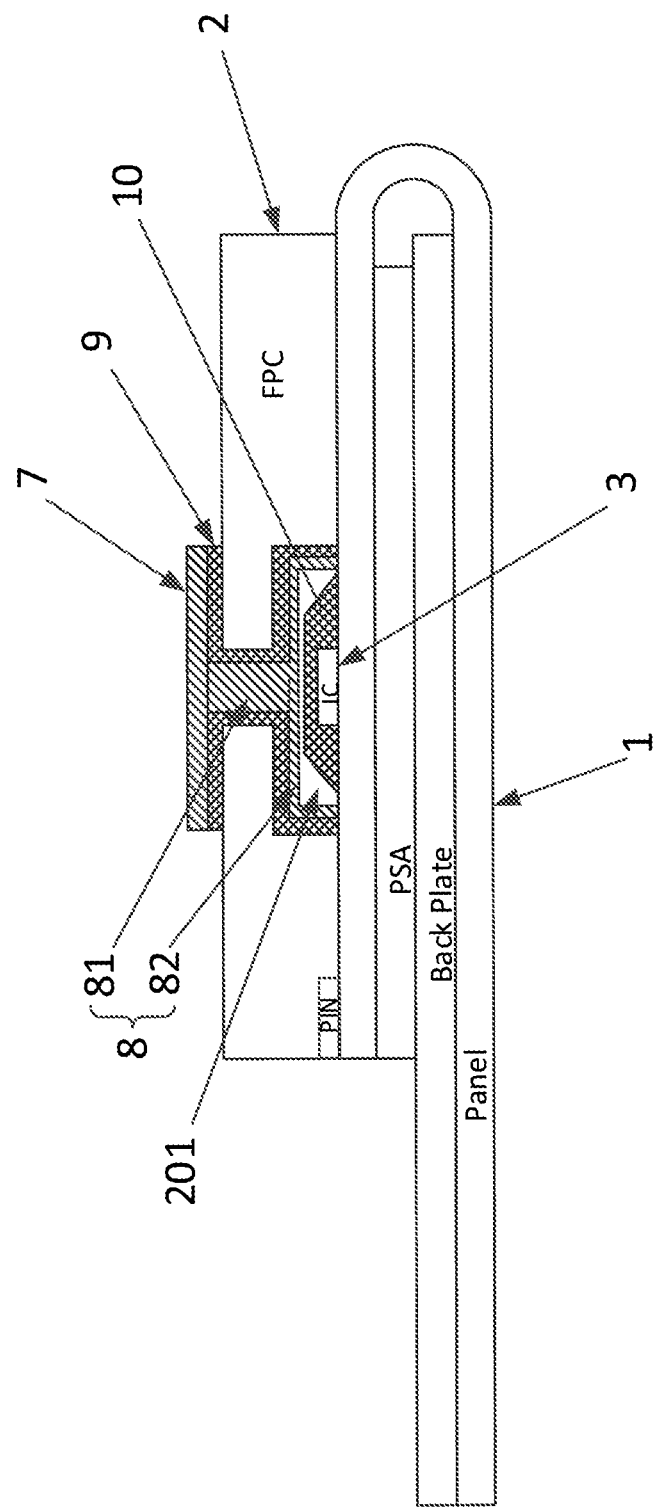
FIG. 4 is another schematic structural diagram of a display module according to an embodiment of the present disclosure.
Figure 5:
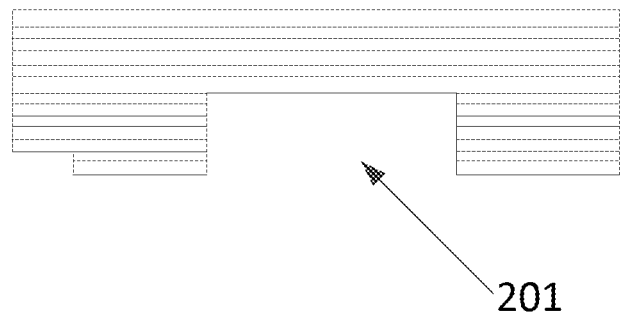
FIG. 5 is a schematic diagram showing a flexible printed circuit after a first accommodating groove is formed according to an embodiment of the present disclosure.
Figure 6:
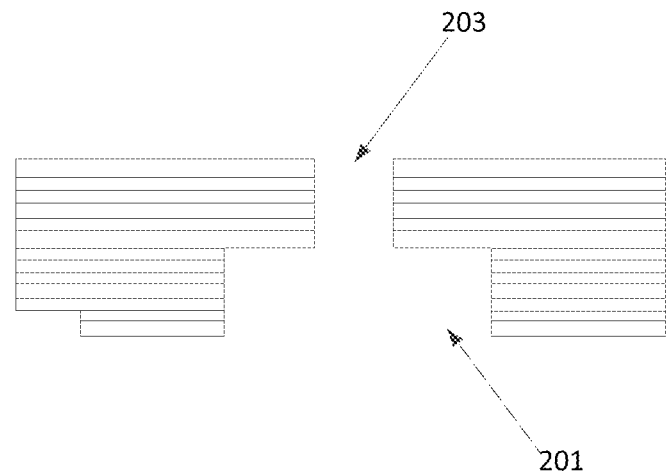
FIG. 6 is a schematic diagram showing a flexible printed circuit after a heat dissipation hole is formed according to an embodiment of the present disclosure.
Figure 7:
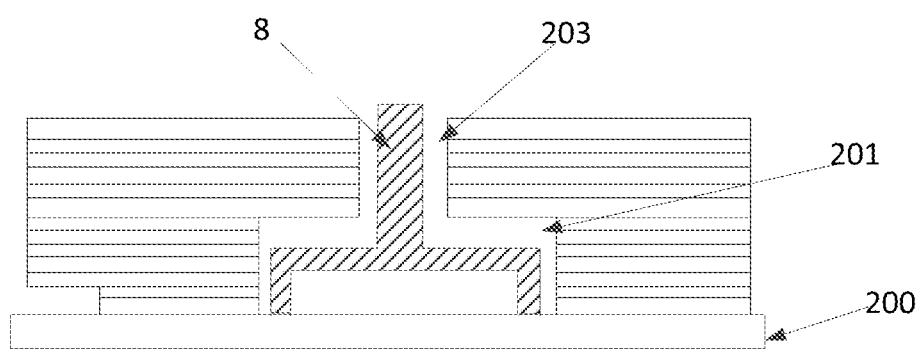
FIG. 7 is a schematic diagram showing a flexible printed circuit after a first heat-conducting metal member is embedded according to an embodiment of the present disclosure.

In an exemplary implementation, a space between the first portion 81 and the heat dissipation hole 203 is filled with an electrical-insulating and heat-conducting adhesive layer (refer to a second electrical-insulating and heat-conducting adhesive layer 9 in FIG. 4), a space between the second portion 82 and the first accommodating groove 201 is filled with an electrical-insulating and heat-conducting adhesive layer, and a space between the second heat-conducting metal member 7 and the second surface is filled with an electrical-insulating and heat-conducting adhesive layer.

It should be noted that, the electrical-insulating and heat-conducting adhesive layer between the first portion 81 and the heat dissipation hole 203, the electrical-insulating and heat-conducting adhesive layer between the second portion 82 and the first accommodating groove 201, and the electrical-insulating and heat-conducting adhesive layer between the second heat-conducting metal member 7 and the second surface are of an integral structure and are integrally formed, with reference to the second electrical-insulating and heat-conducting adhesive layer 9 in FIG. 4.

A connection between the first heat-conducting metal member 8 and the flexible printed circuit 2, and a connection between the second heat-conducting metal member 7 and the first heat-conducting metal member 8. A gap exists between the first heat-conducting metal member 8 and the flexible printed circuit 2, and a gap also exists between the second heat-conducting metal member 7 and the flexible printed circuit 2. The electrical-insulating and heat-conducting adhesive layer fills in these gaps, so that the flexible printed circuit 2 and the driver IC 3 can be protected, and the arrangement of the electrical-insulating and heat-conducting adhesive layer enhances the heat dissipation effect.

In an exemplary implementation, the driver IC 3 is of a strip-shaped structure, and the heat dissipation structure includes one or more heat dissipation units distributed along an extending direction of the driver IC 3, each of the heat dissipation units including the heat dissipation hole 203 and the first heat-conducting metal member 8.

In a specific implementation, each of the heat dissipation units includes the heat dissipation hole 203, the first heat-conducting metal member 8, the second heat-conducting metal member 7, and an electrical-insulating and heat-conducting adhesive layer loaded between the first portion 81 and the heat dissipation hole 203, between the second portion 82 and the first accommodating groove 201, and between the second heat-conducting metal member 7 and the second surface.

If there are a plurality (at least two) of the heat dissipation units, the plurality of heat dissipation units are spaced apart along the extending direction of the driver IC 3.

In an implementation, the size of the driver IC 3 is 40 mm*2 mm, and the maximum length of the heat dissipation hole 203 in the extending direction of the driver IC 3 (when the heat dissipation hole 203 is circular, the maximum length of the heat dissipation hole 203 in the extending direction of the driver IC 3 is the diameter of the heat dissipation hole 203) is 1 to 2 mm, but this is not limiting.

If there is only one heat dissipation unit, the heat dissipation unit can be disposed in the middle of the driver IC 3, and along the extension direction of the driver IC 3, the orthographic projection of the heat dissipation hole 203 onto the display panel 1 can be greater than or equal to one third of the orthographic projection of the driver IC 3 onto the display panel 1, but this is not limiting.

In an exemplary implementation, the driver IC 3 is enveloped externally by an electrical-insulating and heat-conducting adhesive layer.

The area of the orthographic projection of the electrical-insulating and heat-conducting adhesive layer onto the display panel 1 is smaller than the area of the orthographic projection of the second accommodating groove onto the display panel 1.

In an exemplary implementation, a distance between the electrical-insulating and heat-conducting adhesive layer enveloping the driver IC 3 and the second accommodating groove in a direction perpendicular to the first surface is more than 0.2 mm, and a distance between the electrical-insulating and heat-conducting adhesive layer enveloping the driver IC 3 and a side wall of the second accommodating groove in a direction parallel to the first surface is more than 0.9 mm, but this is not limiting.

Hereinafter, the fabrication of the flexible printed circuit 2 according to the present embodiment and a process of assembling the flexible printed circuit 2 with the display panel will be described.

Figure 8:
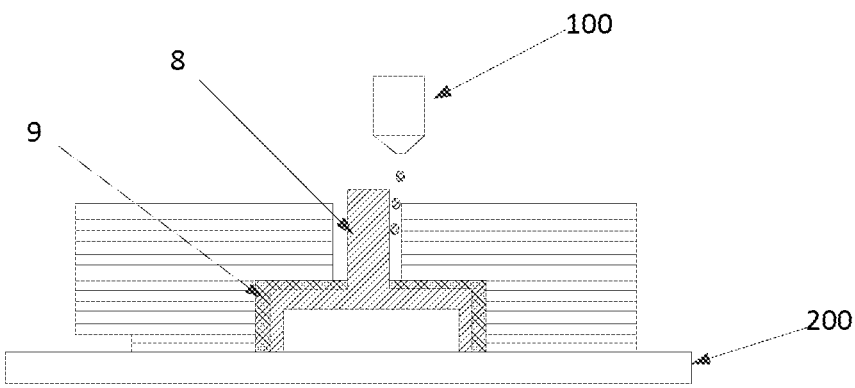
FIG. 8 is a schematic diagram showing a state of potting a heat-conducting adhesive according to an embodiment of the present disclosure.
Figure 9:
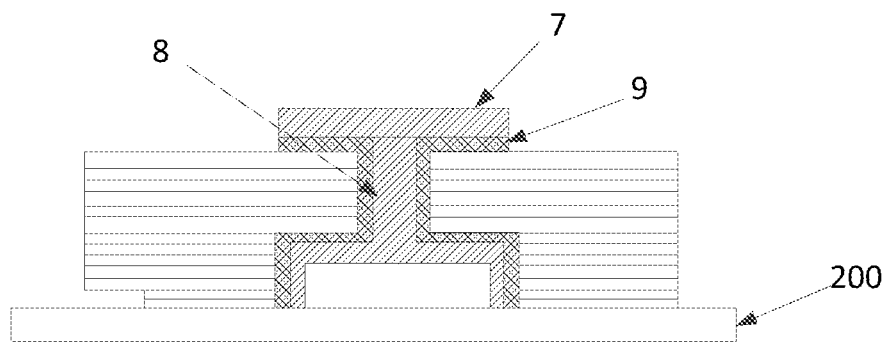
FIG. 9 is a schematic diagram showing a state after a second heat-conducting metal member is fitted according to an embodiment of the present disclosure.
Figure 10:
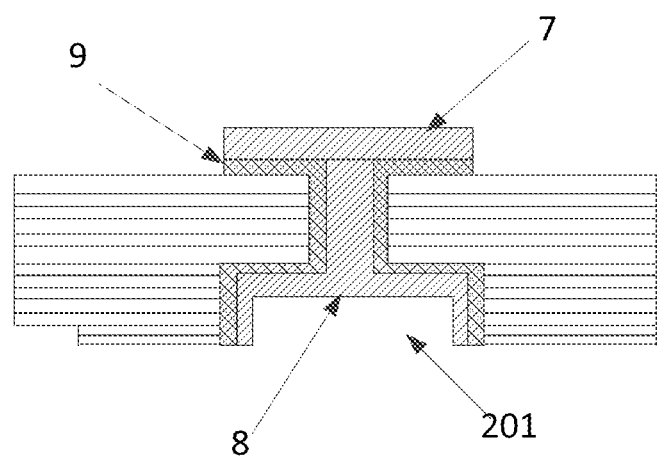
FIG. 10 is a schematic structural diagram of a flexible printed circuit according to an embodiment of the present disclosure.

In the present embodiment, the flexible printed circuit 2 is a multi-layer flexible printed circuit 2. Firstly, providing a laminated multi-layer board-like structure;
  forming a first accommodating groove 201 in a first surface for bonding to the display panel 1, with reference to FIG. 5;
  providing a heat dissipation hole 203, with reference to FIG. 6; the heat dissipation hole 203 is formed through a laser engraving process.
  providing a base substrate 200, then arranging the first heat-conducting metal member 8 on the base substrate 200, and then fitting with the preformed flexible printed circuit 2 so that the first heat-conducting metal member 8 is embedded in the first accommodating groove 201 and the heat dissipation hole 203, with reference to FIG. 7.
  performing potting using the heat-conducting adhesive by means of an adhesive dispensing tool (such as an adhesive dispensing nozzle 100), FIG. 8 is a schematic diagram of a potting process using the heat-conducting adhesive.
  attaching the second heat-conducting metal member 7 to the second surface, with reference to FIG. 9.
  curing the heat-conducting adhesive, and removing the substrate to obtain the flexible printed circuit 2 having the heat dissipation structure, with reference to FIG. 10.

Embodiments of the present disclosure further provide a display device including the above-mentioned display module.

It is to be understood that the above-mentioned embodiments are merely exemplary implementations that have been employed to illustrate the principles of the present disclosure, and that the disclosure is not limited thereto. It will be apparent to those skilled in the art that various variations and improvements can be made in the present disclosure without departing from the spirit or scope of the disclosure, and these variations and improvements are also deemed as falling in the scope of this disclosure.

What is claimed is:

1. A display module, comprising: a display panel and a flexible printed circuit bonded to the display panel; wherein
  the display panel comprises a display area and a non-display area disposed at the periphery of the display area, the non-display area comprises a bonding area disposed on one side of the display area, and a driver integrated circuit (IC) is disposed in the bonding area;
  the flexible printed circuit comprises a main body part, an orthographic projection of the main body part onto the display panel is in the bonding area, and a first accommodating groove for accommodating the driver IC is provided in a first surface of the flexible printed circuit close to the display panel; and
  a heat dissipation structure, extending from within the first accommodating groove to outside the flexible printed circuit, is further disposed between the flexible printed circuit and the bonding area.

2. The display module according to claim 1, wherein the heat dissipation structure comprises a heat-conducting metal structure disposed between the flexible printed circuit and the bonding area.

3. The display module according to claim 2, wherein the heat dissipation structure further comprises an electrical-insulating and beat-conducting adhesive layer between the heat-conducting metal structure and the driver IC.

4. The display module according to claim 3, wherein at least a portion of the driver IC is covered by the electrical-insulating and heat-conducting adhesive layer.

5. The display module according to claim 4, wherein the electrical-insulating and heat-conducting adhesive layer is disposed between at least some of side walls of the first accommodating groove and the driver IC, and the heat-conducting metal structure comprises a metal sheet, one end of the metal sheet extending into the first accommodating groove and being attached to the electrical-insulating and heat-conducting adhesive layer, and an other end of the metal sheet extending out of the flexible printed circuit in a direction away from the first accommodating groove.

6. The display module according to claim 5, wherein the electrical-insulating and heat-conducting adhesive layer is disposed between some of the side walls of the first accommodating groove and the driver IC, the first surface of the flexible printed circuit comprises a first region disposed at the some of the side walls and away from the accommodating groove, and the first region is recessed to form an accommodating space between the flexible printed circuit and the display panel for accommodating the metal sheet.

7. The display module according to claim 5, wherein at least one first through hole extending along a direction perpendicular to the first surface is formed in the flexible printed circuit, the first through hole extends from a bottom of the first accommodating groove towards a direction away from the first surface and penetrates a second surface of the flexible printed circuit opposite to the first surface, an orthographic projection of the first through hole onto the display panel is within an orthographic projection of the electrical-insulating and heat-conducting adhesive layer onto the display panel.

8. The display module according to claim 5, wherein the electrical-insulating and heat-conducting adhesive layer surrounds and covers the driver IC externally, and the metal sheet is an annular structure enclosing the electrical-insulating and heat-conducting adhesive layer peripherally.

9. The display module according to claim 5, wherein the metal sheet is a copper foil.

10. The display module according to claim 3, wherein the heat dissipation structure further comprises a heat dissipation member, the heat dissipation member being attached to a portion of the metal sheet exposed outside the flexible printed circuit.

11. The display module according to claim 10, wherein the heat dissipation member is a thermal conductive adhesive at least partially overlying the portion of the metal sheet exposed outside the flexible printed circuit.

12. The display module according to claim 1, wherein the heat dissipation structure comprises:
   a heat dissipation hole provided at a bottom of the first accommodating groove and penetrating the flexible printed circuit;
   a first heat-conducting metal member, wherein the first beat-conducting metal member comprises a first portion passing through the heat dissipation hole and a second portion extending into the first accommodating groove and being attached to the display panel, and the second portion is a second accommodating groove enclosing the driver IC externally.

13. The display module according to claim 12, wherein the heat dissipation structure further comprises a second heat-conducting metal member attached to the first heat-conducting metal member, the second heat-conducting metal member being disposed in parallel on a second surface of the flexible printed circuit opposite to the first surface.

14. The display module according to claim 13, wherein a space between the first portion and the heat dissipation hole is filled with an electrical-insulating and heat-conducting adhesive layer, a space between the second portion and the first accommodating groove is filled with an electrical-insulating and heat-conducting adhesive layer, and a space between the second heat-conducting metal member and the second surface is filled with an electrical-insulating and heat-conducting adhesive layer.

15. The display module according to claim 12, wherein the driver IC is a strip-shaped structure, the heat dissipation structure comprises one or more heat dissipation units distributed along an extension direction of the driver IC, and each of the heat dissipation units comprises the heat dissipation hole and the first heat-conducting metal member.

16. The display module according to claim 12, wherein the driver IC is surrounded and covered externally by an electrical-insulating and heat-conducting adhesive layer.

17. The display module according to claim 1, wherein a bonding part for bonding to the display panel is disposed on the flexible printed circuit, and the bonding part and the first accommodating groove are located on a same side of the flexible printed circuit.

18. A display device, comprising a display module, wherein the display module comprises: a display panel and a flexible printed circuit bonded to the display panel:
   the display panel comprises a display area and a non-display area disposed at the periphery of the display area, the non-display area comprises a bonding area disposed on one side of the display area, and a driver integrated circuit (IC) is disposed in the bonding area;
   the flexible printed circuit comprises a main body part, an orthographic projection of the main body part onto the display panel is in the bonding area, and a first accommodating groove for accommodating the driver IC is provided in a first surface of the flexible printed circuit close to the display panel; and
   a heat dissipation structure, extending from within the first accommodating groove to outside the flexible printed circuit, is further disposed between the flexible printed circuit and the bonding area.

19. The display module according to claim 13, wherein the driver IC is a strip-shaped structure, the heat dissipation structure comprises one or more heat dissipation units distributed along an extension direction of the driver IC, and each of the heat dissipation units comprises the heat dissipation hole and the first heat-conducting metal member.

20. The display module according to claim 14, wherein the driver IC is a strip-shaped structure, the heat dissipation structure comprises one or more heat dissipation units distributed along an extension direction of the driver IC, and each of the heat dissipation units comprises the heat dissipation hole and the first heat-conducting metal member.

* * * * *